(12) United States Patent
Sauciuc et al.

(10) Patent No.: US 6,549,407 B1
(45) Date of Patent: Apr. 15, 2003

(54) HEAT EXCHANGER RETENTION MECHANISM

(75) Inventors: Ioan Sauciuc, Phoenix, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/034,963

(22) Filed: Dec. 27, 2001

(51) Int. Cl.[7] .................................................. H05K 7/20
(52) U.S. Cl. ........................ 361/699; 361/698; 361/701; 361/702; 361/719; 257/714; 174/15.1; 165/80.4
(58) Field of Search .................................. 361/699, 690, 361/698, 704, 719–121; 165/80.2, 80.3, 80.4, 185; 174/15.1, 16.3; 257/704, 706, 707, 712–714, 721, 722

(56) References Cited

U.S. PATENT DOCUMENTS

| | | | | |
|---|---|---|---|---|
| 4,233,645 A | * | 11/1980 | Balderes et al. | ........... 174/16.3 |
| 4,607,685 A | * | 8/1986 | Mitchell, Jr. | ................. 165/185 |
| 5,227,663 A | * | 7/1993 | Patil et al. | .................... 257/688 |
| 5,699,227 A | | 12/1997 | Kolman et al. | |
| 5,727,618 A | * | 3/1998 | Mundinger et al. | ......... 165/185 |
| 5,847,366 A | * | 12/1998 | Grunfeld | .................... 165/80.4 |
| 5,933,323 A | * | 8/1999 | Bhatia et al. | ............... 165/80.2 |
| 5,945,736 A | * | 8/1999 | Rife et al. | .................... 257/706 |
| 5,949,647 A | | 9/1999 | Kolman et al. | |
| 6,021,045 A | * | 2/2000 | Johnson | ....................... 165/185 |
| 6,293,331 B1 | * | 9/2001 | Wang | .......................... 165/185 |
| 6,304,451 B1 | * | 10/2001 | Rife | ........................... 361/704 |
| 6,317,326 B1 | * | 11/2001 | Vogel et al. | ................ 165/80.4 |
| 6,343,012 B1 | * | 1/2002 | Rife | .............................. 165/185 |

\* cited by examiner

Primary Examiner—Boris Chervinsky
(74) Attorney, Agent, or Firm—Robert G. Winkle

(57) ABSTRACT

A heat dissipation device including a heat spreader or support structure having a first surface and a second surface with a flange extending from the heat spreader second surface. A heat exchanger is disposed within a housing and the housing is attached to the flange.

21 Claims, 8 Drawing Sheets

HEAT EXCHANGER RETENTION MECHANISM

BACKGROUND OF THE INVENTION

1. Field of the Invention

The present invention relates to apparatus and methods for removal of heat from electronic devices. In particular, the present invention relates to a threaded heat dissipation device retention mechanism, and, most particularly, to such mechanisms used with refrigeration or liquid cooling systems.

2. State of the Art

Higher performance, lower cost, increased miniaturization of integrated circuit components, and greater packaging densities of integrated circuits are ongoing goals of the computer industry. As these goals are achieved, microelectronic dice become smaller. Accordingly, the density of power consumption of the integrated circuit components in the microelectronic die has increased, which, in turn, increases the average junction temperature of the microelectronic die. If the temperature of the microelectronic die becomes too high, the integrated circuits of the microelectronic die may be damaged or destroyed.

Various apparatus and techniques have been used and are presently being used for removing heat from microelectronic dice. One such heat dissipation technique involves the attachment of an integrated heat spreader to a microelectronic die. FIG. 10 illustrates an assembly 300 comprising a microelectronic die 302 (illustrated as a flip chip) physically and electrically attached to a substrate 304 (such as an interposer, a motherboard, or the like) by a plurality of solder balls 306 extending between pads 308 on an active surface 312 of the microelectronic die 302 and lands 314 on the substrate 304. To mechanically and physically reinforce the solder balls 306 connecting the microelectronic die pads 308 and the substrate lands 314, an underfill material 310 is disposed therebetween.

The assembly 300 further includes an integrated heat spreader 316 comprising a conductive plate 318 having at least one extension 322. The integrated heat spreader 316 is attached to a surface 324 of the substrate 304 by an adhesive layer 326 between the substrate surface 324 and the extensions 322. A back surface 332 of the microelectronic die 302 is in thermal contact with a first surface 328 of the integrated heat spreader conductive plate 318. A first thermal interface material 334 may be disposed between the microelectronic die back surface 332 and the integrated heat spreader conductive plate first surface 328 to enhance conductive heat transfer therebetween.

The integrated heat spreader 316 is usually constructed from a thermally conductive material, such as copper, copper alloys, aluminum, aluminum alloys, and the like. The heat generated by the microelectronic die 302 is drawn into the integrated heat spreader 316 by conductive heat transfer. It is, of course, understood that additional heat dissipation devices can be attached to a second surface 338 of the integrated heat spreader conductive plate 318. These additional heat dissipation devices may include heat slugs and high surface area (finned) heat sinks, and may further include fans attached thereto, as will be evident to those skilled in the art. However, with the increasing heat generation by microelectronic dice, such heat dissipation devices have become or will become insufficient for removing heat. Thus, heat exchangers, such as liquid cooling and refrigeration systems, have become or will become necessary. In particular, refrigeration systems look to be the most promising heat dissipation solution for most of the future processor applications, as they are able to provide very low thermal resistances.

As shown in FIG. 11, a heat exchanger 342 is placed in thermal contact with the integrated heat spreader conductive plate second surface 338. A heat transfer fluid (represented by arrows 352) flows into inlet 344, draws heat from the heat exchanger 342, and exits from outlet 346, wherein the heat is removed from the heat transfer fluid 352 by heat exchange in a remote location (not shown), as will be evident to those skilled in the art. A second thermal interface material 354 is disposed between the heat exchanger 342 and the integrated heat spreader conductive plate second surface 338. The heat exchanger 342 is held in place by a retention clip 356.

However, in such a configuration, the force of the retention clip 356 on the heat exchanger 342 and the thermal cycling of the microelectronic die 302 during operation may result in the second thermal interface material 354 being "pumped out" from between the heat exchanger 342 and the integrated heat spreader conductive plate second surface 338. The loss of the second thermal interface material 354 results in higher thermal resistances. This problem is particularly an issue when a phase-change material is used for the second thermal interface material 354.

Therefore, it would be advantageous to develop retention mechanisms for the attachment of refrigeration and liquid cooling systems to effectively remove heat from microelectronic dice.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
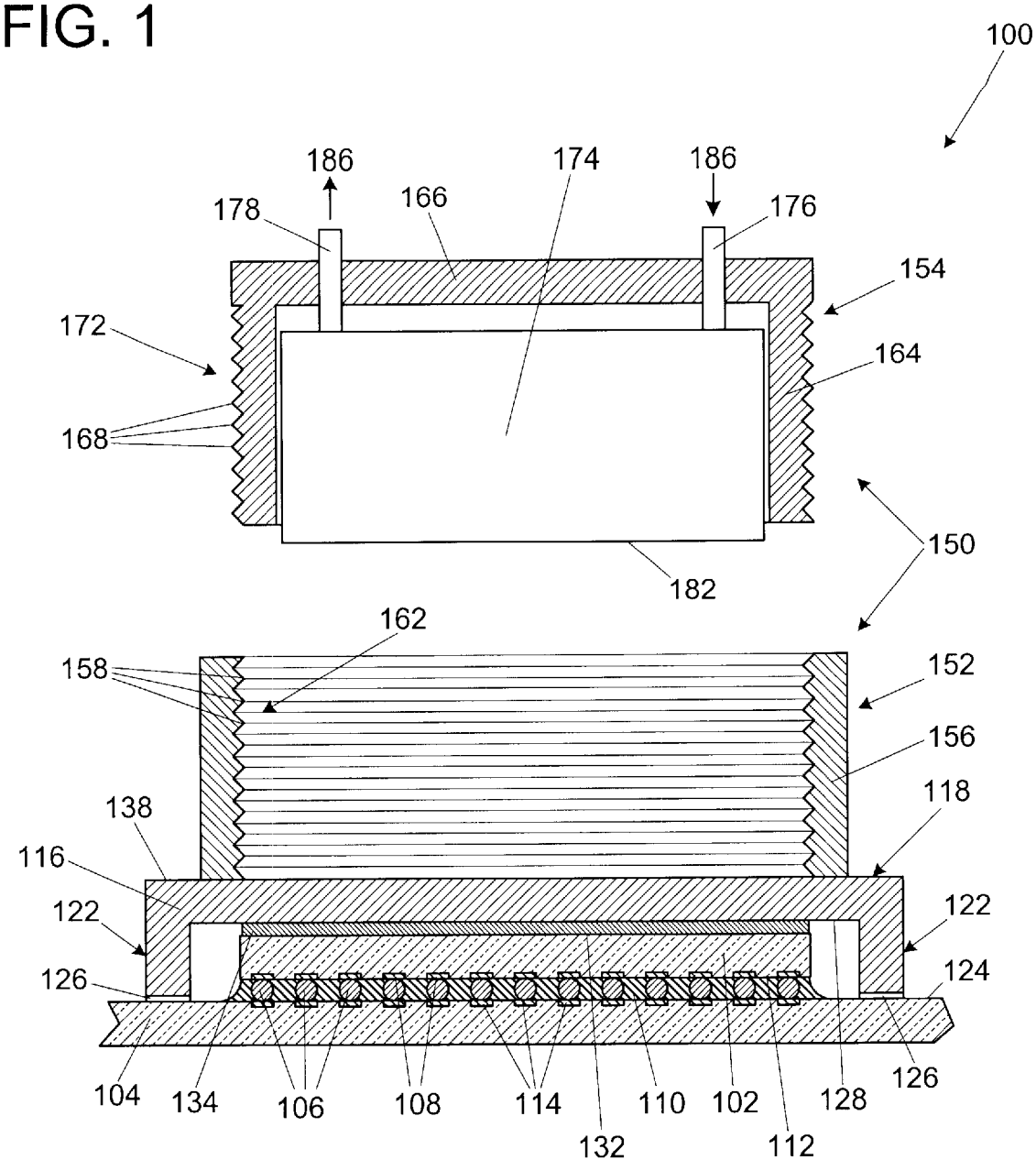
FIGS. 1 and 2 are side cross-sectional views of an embodiment of a microelectronic die assembly, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 2:
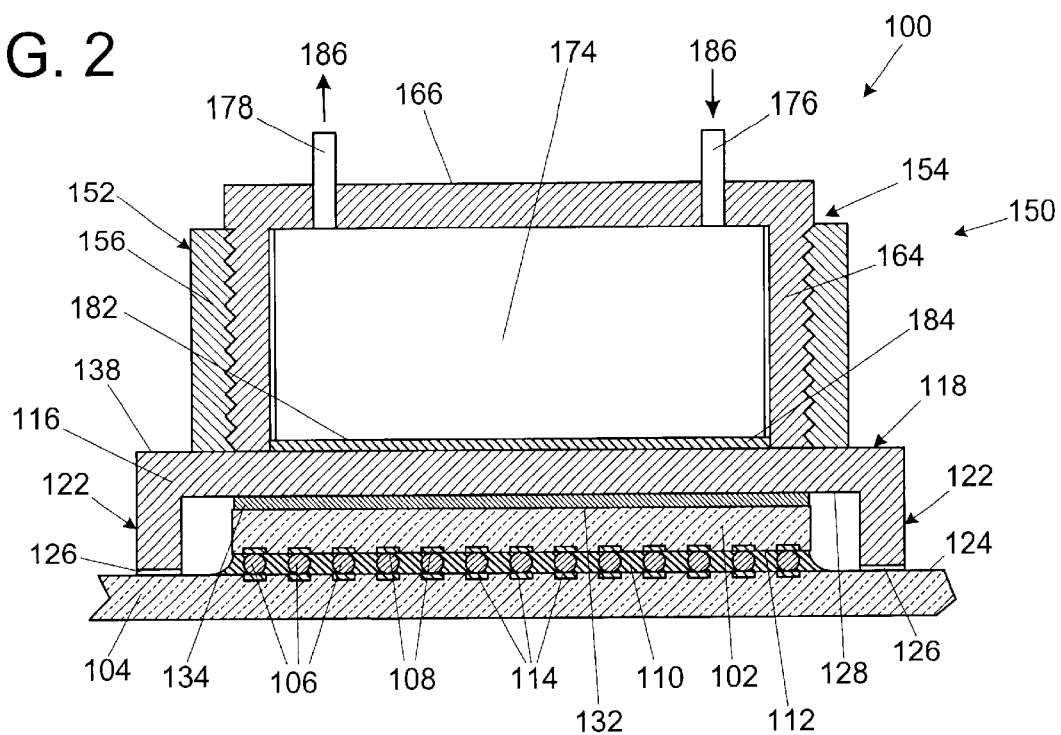
Figure 9:
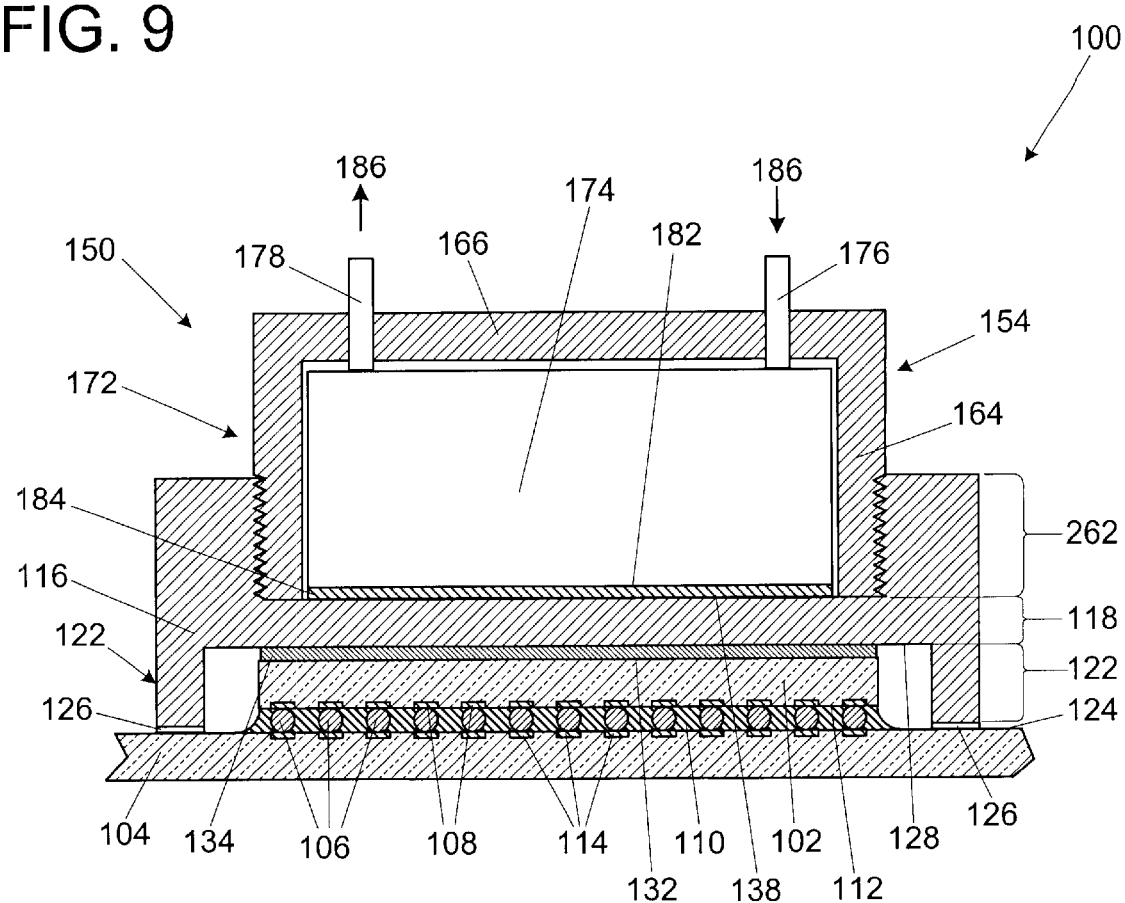
Figure 10:
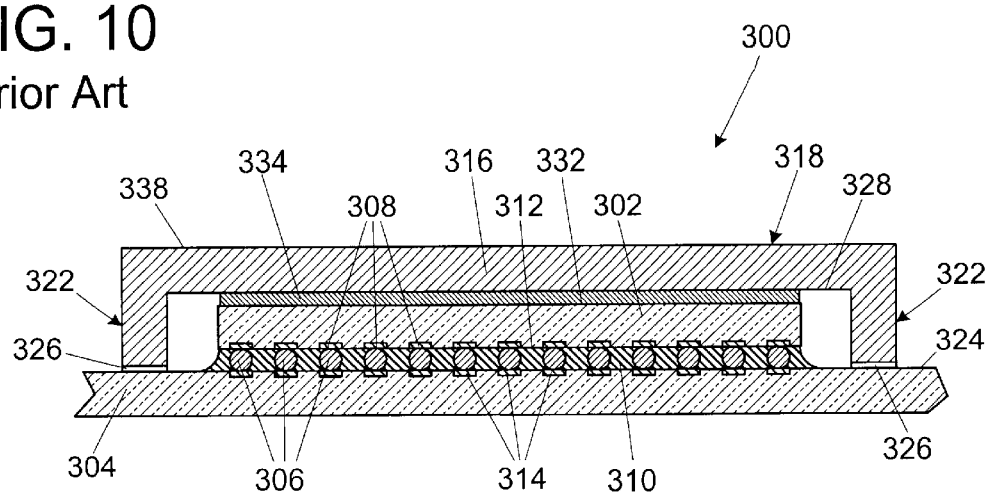
FIG. 10 is a side cross-sectional view of a heat dissipation device attached to a microelectronic die, as known in the art.
Figure 11:
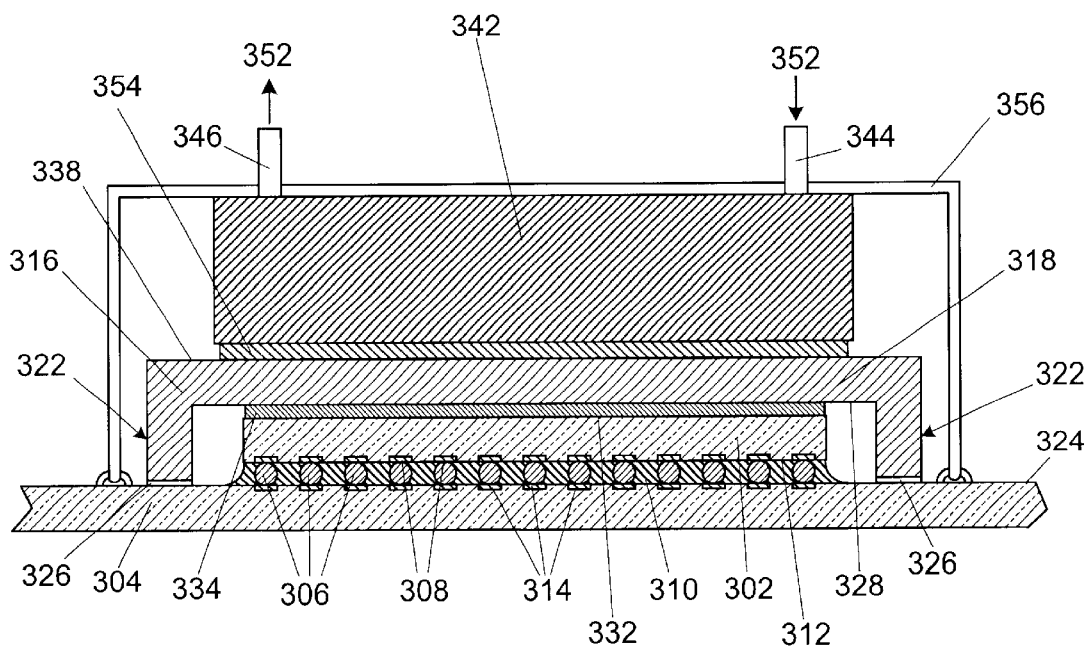
FIG. 11 is a side cross-sectional view of a heat exchanger attached to a heat dissipation device, as known in the art.

FIGS. 1 and 2 illustrate a microelectronic device assembly 100 (partially disassembled and assembled, respectively), which is similar to that shown in FIG. 9 and comprises a microelectronic die 102 (illustrated as a flip chip) physically and electrically attached to a substrate 104 (such as an interposer, a motherboard, or the like) by a plurality of conductive bumps 106, such as solder balls, conductive particle filled polymers, and the like, extending between pads 108 on an active surface 112 of the microelectronic die 102 and lands 114 on the substrate 104. To mechanically and physically reinforce the conductive bumps 106 connecting the microelectronic die pads 108 and the substrate lands 114, an underfill material 110, such as an epoxy material, is disposed therebetween.

The microelectronic die assembly 100 further includes an integrated heat spreader 116 comprising a conductive plate 118 having at least one extension 122. The integrated heat spreader 116 is attached to a surface 124 of the substrate 104 by an adhesive layer 126 between the substrate surface 124 and the extensions 122. A back surface 132 of the microelectronic die 102 is in thermal contact with a first surface 128 of the integrated heat spreader conductive plate 118. A first thermal interface material 134 may be disposed between the microelectronic die back surface 132 and the integrated heat spreader conductive plate first surface 128 to enhance conductive heat transfer therebetween. The first thermal interface material 134 should have high thermal conductivity and may include, but is not limited to, thermal grease, phase-change material, metal filled polymer matrix, solder (alloys of lead, tin, indium, silver, copper, and the like), and other such materials known in the art. The integrated heat spreader 116 is usually constructed from a thermally conductive material, such as copper, copper alloys, aluminum, aluminum alloys, and the like. The heat generated by the microelectronic die 102 is drawn into the integrated heat spreader 116 by conductive heat transfer.

The microelectronic die assembly 100 further includes a heat exchanger retention mechanism 150 comprises a flange 152 attached to a second surface 138 of the integrated heat spreader conductive plate 118 and a housing 154, which interfaces with the flange 152. This flange 152 is preferably a hollow cylindrical collar 156 having threads 158 on an interior surface 162. The housing 154 is preferably a hollow cylindrical collar 164 having a lid 166 substantially capping one end thereof and having threads 168 on an exterior surface 172 thereof. When the heat exchanger retention mechanism 150 is assembled, as shown in FIG. 2, the flange threads 158 and the housing threads 168 are mated to one another. In other terms, the housing 154 is screwed into the flange 152. The flange 152 and the housing 154 may be made of thermally conductive material, such as copper, copper alloys, aluminum, aluminum alloys, and the like. However, to prevent condensation, low thermal conductivity materials, such as plastics, can preferably be used for the flange 152, and, also, may be used for the housing 154.

Prior to assembly, a heat exchanger 174 is disposed within the housing 154. The heat exchanger 174 may comprise a liquid cooling system, a refrigeration system, or the like. An inlet line 176 of the heat exchanger 174 and an outlet line 178 of the heat exchanger 174 extend through the housing lid 166. When assembled, a contact surface 182 of the heat exchanger 174 is in thermal contact with the integrated heat spreader conductive plate second surface 138. As shown in FIG. 2, a second thermal interface material 184 may be disposed between the heat exchange contact surface 182 and the integrated heat spreader conductive plate second surface 138. As with the first thermal interface material 134, the second thermal interface material 184 should have high thermal conductivity and may include, but is not limited to, thermal grease, phase-change material, metal filled polymer matrix, solder (alloys of lead, tin, indium, silver, copper, and the like), and other such materials known in the art. It is, of course, understood that the second thermal interface material 184 may not be necessary, particularly with refrigeration systems.

The heat exchanger 174 draws heat from the integrated heat spreader 116 by conductive heat transfer. A heat transfer fluid (represented by arrows 186) flows into inlet line 176, draws heat from the heat exchanger 174, and exits from outlet line 178, wherein the heat is removed from the heat transfer fluid 186 by heat exchange in a remote location (not shown), as will be evident to those skilled in the art.

Figure 3:
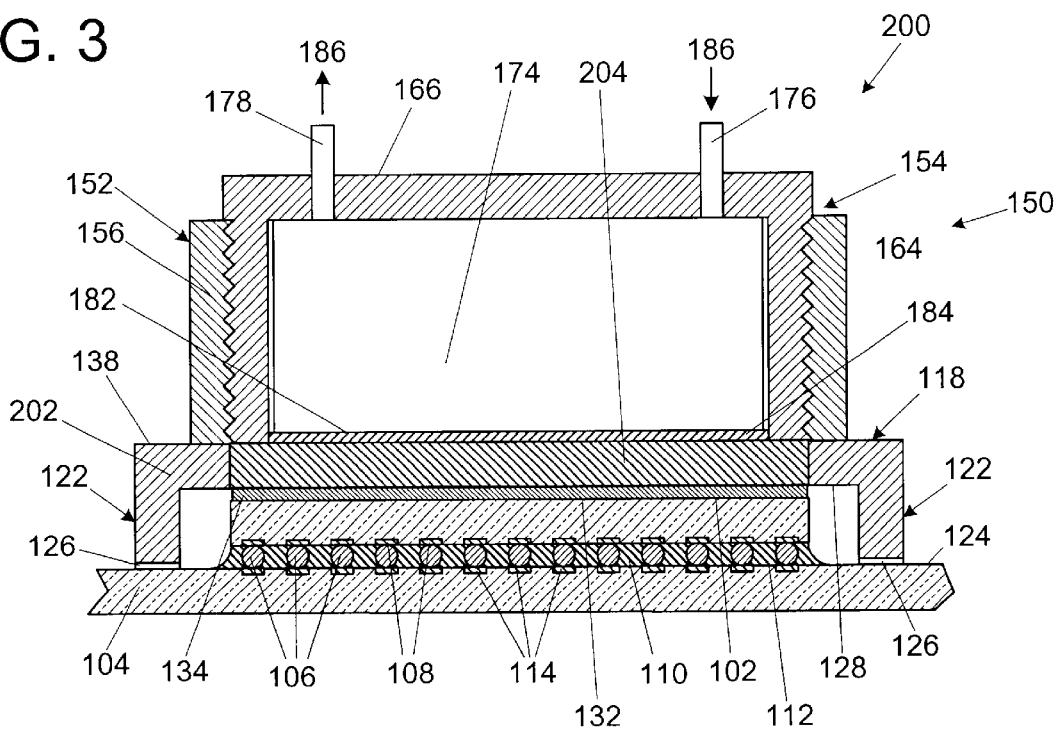
FIG. 3 is a side cross-sectional view of another embodiment of a microelectronic die assembly, according to the present invention.

FIG. 3 illustrates another microelectronic device assembly 200 of the present invention. The microelectronic device assembly 200 is similar to the microelectronic device assembly 100 of FIGS. 1 and 2. However, the integrated heat spreader 202 comprises an inexpensive low thermal conductivity material, such as plastic, having a thermally conductive insert 204 integrated therein. The thermally conductive insert 204 is positioned between the microelectronic die 102 and the heat exchanger 174 and may be made of copper, copper alloys, aluminum, aluminum alloys, and the like. A preferred method of fabrication comprises injection molding plastic around a copper insert.

Figure 4:
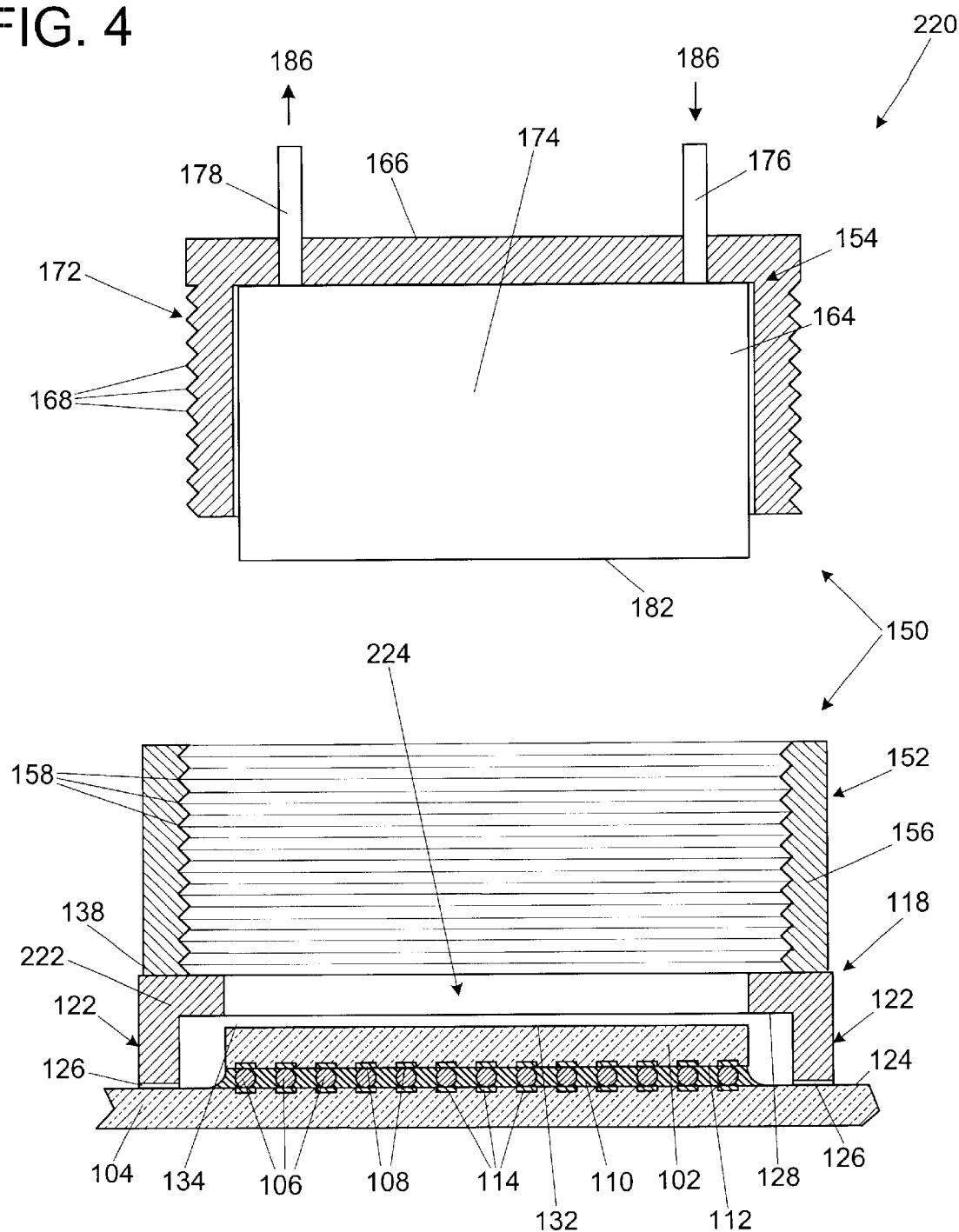
FIGS. 4 and 5 are side cross-sectional views of yet another embodiment of a microelectronic die assembly, according to the present invention.
Figure 5:
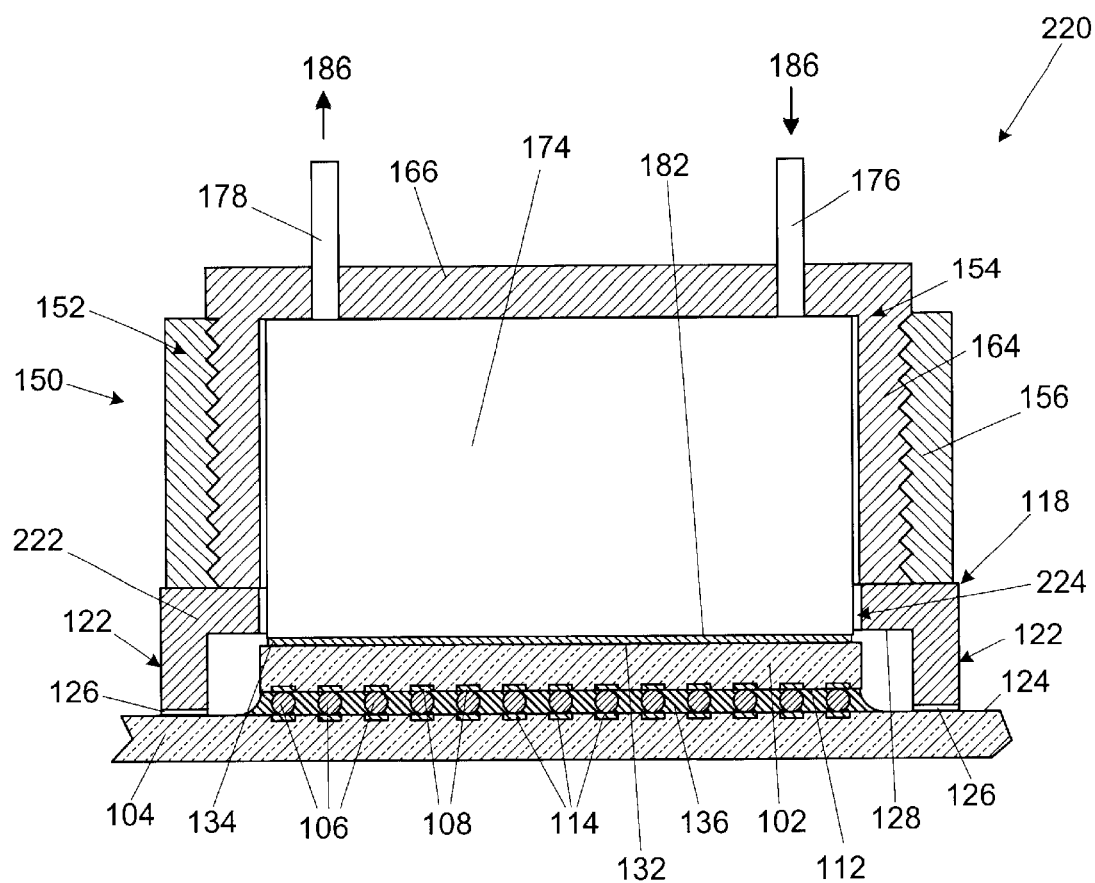

FIGS. 4 and 5 illustrate another microelectronic device assembly 220 of the present invention. The microelectronic device assembly 220 is similar to the microelectronic device assembly 100 of FIGS. 1 and 2. However, the integrated heat spreader may be a support structure 222 that may comprise an inexpensive low thermal conductivity material, such as plastic, and has an opening 224 therethrough over the microelectronic die 102. When assembled as shown in FIG. 5, the heat exchanger 174 extends through the opening 224 to thermally contact the microelectronic die 102. The first thermal interface material 134 may be disposed between the heat exchanger 174 and the microelectronic die 102, if required.

Figure 6:
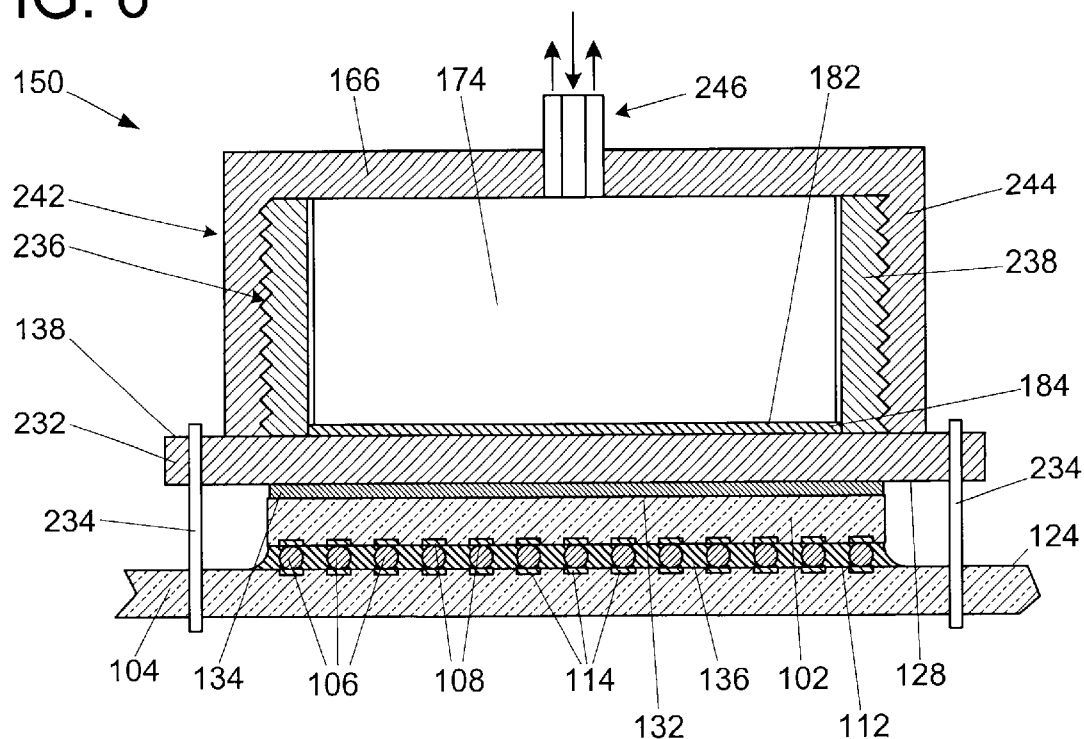
FIG. 6 is a side cross-sectional view of a still another embodiment of a microelectronic die assembly, according to the present invention.

The present invention is not limited to the components described in proceeding figures. As shown in FIG. 6, the integrated heat spreader may be a flat plate heat spreader 232 stabilized by pins 234, screws, or the like. The flange 236 may be is a hollow cylindrical collar 238 having threads on an exterior surface. The housing 242 may be a hollow cylindrical collar 244 having threads on an interior surface.

The inlet and outlet may be a single co-axial pipe 246, which would facilitate the threaded motion used to attach the housing to the flange. Another possibility is a captured, but floating disk through which the separate inlet and outlet pass, as previously shown. The housing would then rotate around the captured plate when attaching it to the flange.

Figure 7:
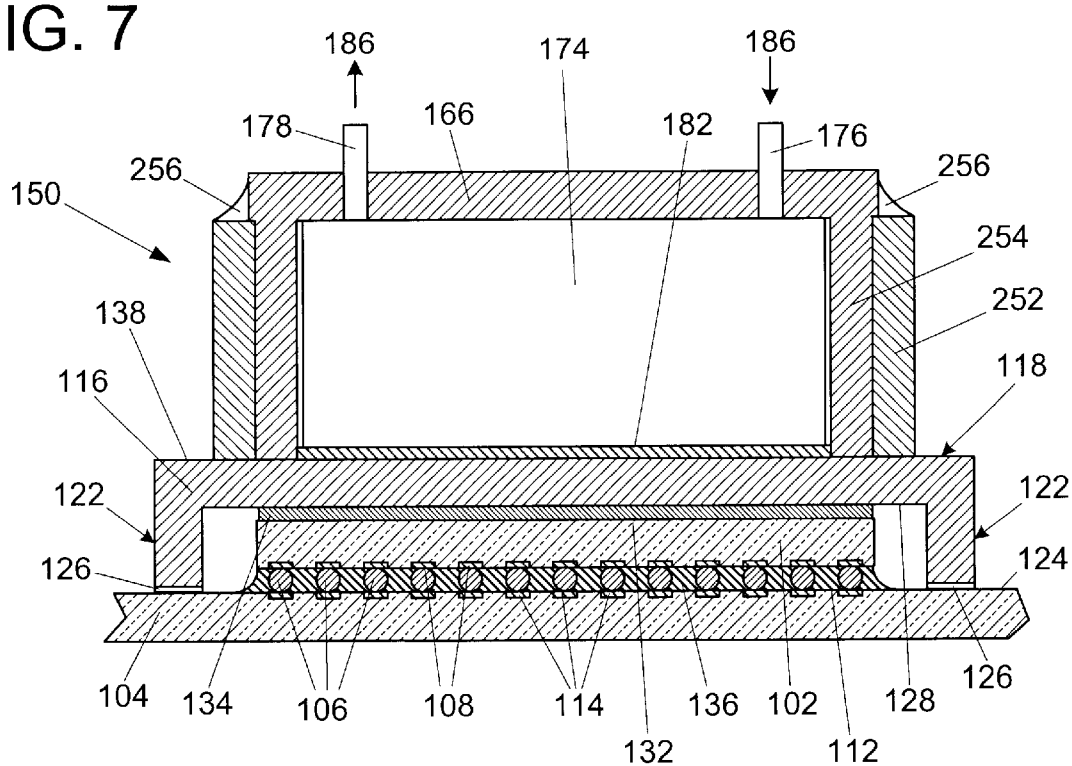
FIG. 7 is a side cross-sectional view of still yet another embodiment of a microelectronic die assembly, according to the present invention.

Furthermore, as shown in FIG. 7, the flange 252 and the housing 254 need not be threaded. They may merely be slideably engaged and may be affixed to one another with an adhesive 256. This allows the flange 252 and the housing 254 to have any cross section, including square, rectangular, oval, triangular, and the like.

Figure 8:
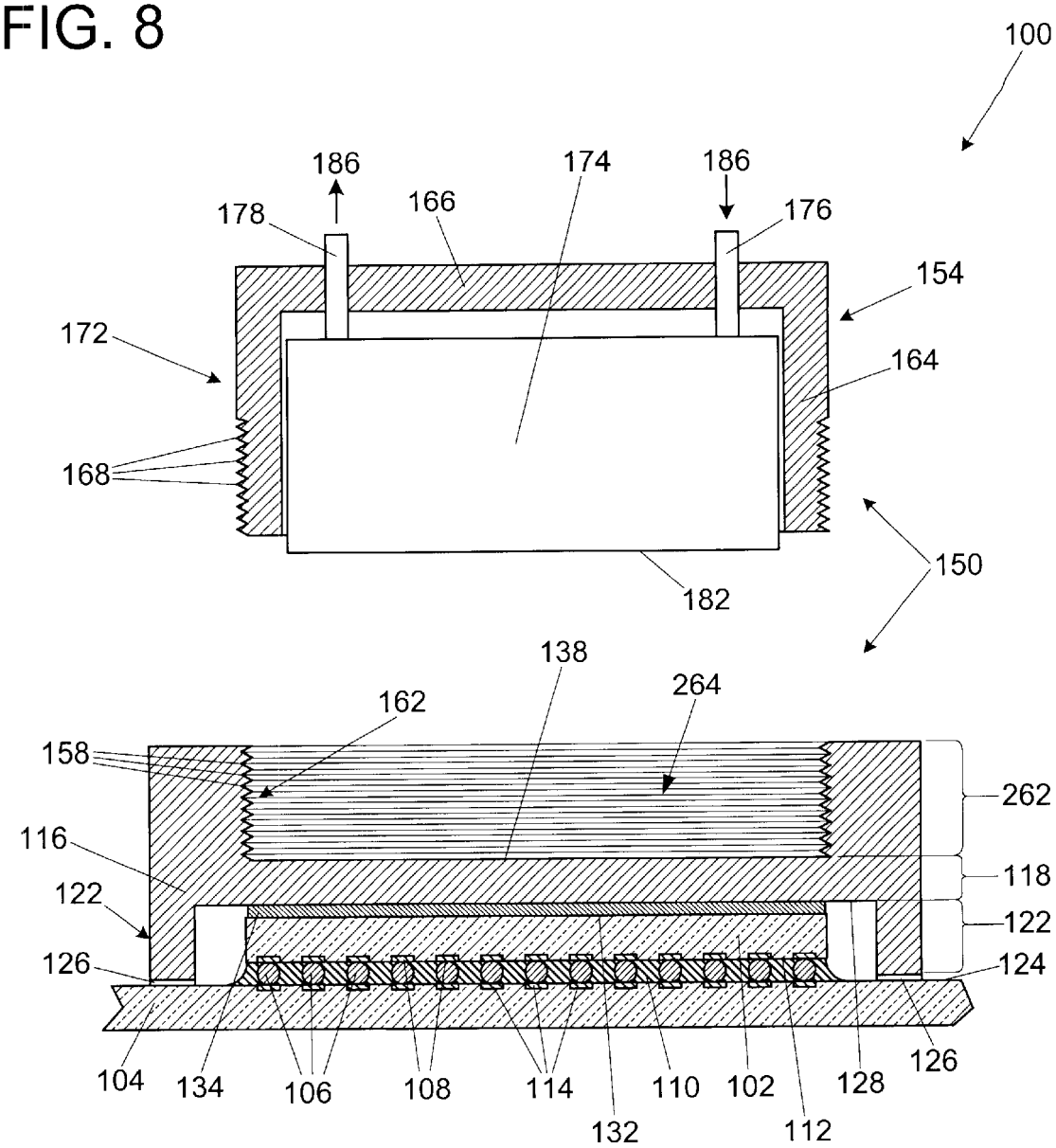
FIGS. 8 and 9 are side cross-sectional views of a further embodiment of a microelectronic die assembly, according to the present invention.

It is, of course, understood that the flange may be an integral part of the integrated heat spreader. As shown in FIGS. 8 and 9, the flange 262 is formed by milling a recess 264 into the integrated heat spreader 116, wherein the integrated heat spreader second surface 138 is defined as the bottom of recess 264.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A heat dissipation device, comprising:
   a heat spreader having a first surface and a second surface;
   a flange extending from said heat spreader second surface;
   a housing engaging said flange, said housing comprising a hollow cylindrical collar having a lid substantially capping one end thereof; and
   a heat exchanger disposed within said housing, wherein a contact surface of said heat exchanger is in thermal contact with said heat spreader second surface.

2. The heat dissipation device of claim 1, wherein said flange comprises a hollow cylindrical collar having threads and wherein said housing having threads that are adapted to engage said flange threads.

3. The heat dissipation device of claim 1, wherein said heat spreader comprises at least one heat transfer liquid inlet line and at least one heat transfer liquid outlet line extending through said housing.

4. The heat dissipation device of claim 3, wherein said heat transfer liquid inlet line and said heat transfer liquid outlet line are substantially co-axial to one another.

5. The heat dissipation device of claim 1, wherein a thermal interface material is disposed between said heat exchanger contact surface and side heat spreader second surface.

6. A heat dissipation device, comprising:
   a support structure having a first surface and second surface and having an opening defined between said support structure first surface and said support structure second surface;
   a flange extending from said support structure second surface which substantially surrounds said support structure opening;
   a housing engaging said flange, said housing comprising a hollow cylindrical collar having a lid substantially capping one end thereof; and
   a heat exchanger disposed within said housing, wherein a contact surface of said heat exchanger extends through said support structure opening.

7. The heat dissipation device of claim 6, wherein said flange comprises a hollow cylindrical collar having threads and wherein said housing having threads that are adapted to engage said flange threads.

8. The heat dissipation device of claim 6, wherein said heat spreader comprises at least one heat transfer liquid inlet line and at least one heat transfer liquid outlet line extending through said housing.

9. The heat dissipation device of claim 8, wherein said heat transfer liquid inlet line and said heat transfer liquid outlet line are substantially co-axial to one another.

10. A microelectronic device assembly, comprising:
    a microelectronic die having an active surface and a back surface, wherein said active surface is electronically attached to a substrate;
    a heat spreader having a first surface and second surface, wherein said heat spreader first surface thermally contacts said microelectronic die back surface;
    a flange extending from said heat spreader second surface;
    a housing engaging said flange, said housing comprising a hollow cylindrical collar having a lid substantially capping one end thereof; and
    a heat exchanger disposed within said housing, wherein a contact surface of said heat exchanger is in thermal contact with said heat spreader second surface.

11. The microelectronic device assembly of claim 10, wherein said flange comprises a hollow cylindrical collar having threads and wherein said housing having threads that are adapted to engage said flange threads.

12. The microelectronic device assembly of claim 10, wherein said heat spreader comprises at least one heat transfer liquid inlet line and at least one heat transfer liquid outlet line extending through said housing.

13. The microelectronic device assembly of claim 10, wherein said heat spreader comprises a thermally conductive insert disposed between said microelectronic back surface and said heat exchanger.

14. The microelectronic device assembly of claim 10, wherein said heat spreader is attached to said substrate.

15. The microelectronic device assembly of claim 10, wherein a first thermal interface material is disposed between said microelectronic die back surface and said heat spreader first surface.

16. The microelectronic device assembly of claim 10, wherein a second thermal interface material is disposed between said heat exchanger contact surface and side heat spreader second surface.

17. A microelectronic device assembly, comprising:
    a microelectronic die having an active surface and a back surface, wherein said active surface is electronically attached to a substrate;
    a support structure having a first surface and second surface and having an opening defined between said support structure first surface and said support structure second surface;
    a flange extending from said support structure second surface;
    a housing engaging said flange, said housing comprising a hollow cylindrical collar having a lid substantially capping one end thereof; and
    a heat exchanger disposed within said housing, wherein a contact surface of said heat exchanger extends through said support structure makes thermal contact with said microelectronic die back surface.

18. The microelectronic device assembly of claim 17, wherein said flange comprises a hollow cylindrical collar having threads and wherein said housing having threads that are adapted to engage said flange threads.

19. The microelectronic device assembly of claim 17, wherein said heat spreader comprises at least one heat transfer liquid inlet line and at least one heat transfer liquid outlet line extending through said housing.

20. The microelectronic device assembly of claim 17, wherein said support structure is attached to said substrate.

21. The microelectronic device assembly of claim 17, wherein a thermal interface material is disposed between said heat exchanger contact surface and said microelectronic die back surface.

* * * * *